United States Patent
Gao et al.

(10) Patent No.: US 12,351,043 B2
(45) Date of Patent: Jul. 8, 2025

(54) ELECTROCHEMICAL SYSTEMS, METHODS, AND DEVICES USING STACKED ELECTRODE ASSEMBLIES WITH IN-STACK SENSOR ARRAYS

(71) Applicant: GM GLOBAL TECHNOLOGY OPERATIONS LLC, Detroit, MI (US)

(72) Inventors: Jing Gao, Rochester, MI (US); Brian J. Koch, Berkley, MI (US); Taylor R. Garrick, Royal Oak, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 855 days.

(21) Appl. No.: 17/479,558

(22) Filed: Sep. 20, 2021

(65) Prior Publication Data

US 2023/0091154 A1    Mar. 23, 2023

(51) Int. Cl.
| | |
|---|---|
| *H01M 50/569* | (2021.01) |
| *B60L 50/64* | (2019.01) |
| *G01R 31/396* | (2019.01) |
| *H01M 10/052* | (2010.01) |
| *H01M 10/0585* | (2010.01) |

(Continued)

(52) U.S. Cl.
CPC ............ *B60L 50/64* (2019.02); *G01R 31/396* (2019.01); *H01M 10/052* (2013.01); *H01M 10/0585* (2013.01); *H01M 10/48* (2013.01); *H01M 50/46* (2021.01); *H01M 50/569* (2021.01); *B60K 6/26* (2013.01); *B60K 6/28* (2013.01);

(Continued)

(58) Field of Classification Search
CPC ............... H01M 10/052; H01M 10/48; H01M 10/0585; H01M 50/46; H01M 50/569
See application file for complete search history.

(56) References Cited

U.S. PATENT DOCUMENTS

| | | |
|---|---|---|
| 6,275,004 B1 | 8/2001 | Tamai et al. |
| 7,851,085 B2 | 12/2010 | Obrovac et al. |

(Continued)

FOREIGN PATENT DOCUMENTS

JP    2012-079582 A    *    4/2012    ............ H01M 10/04

OTHER PUBLICATIONS

Machine Translation JP 2012-079582 A (Year: 2012).*

*Primary Examiner* — Osei K Amponsah
(74) *Attorney, Agent, or Firm* — Quinn IP Law

(57) ABSTRACT

Presented are electrochemical devices with in-stack sensor arrays, methods for making/using such electrochemical devices, and lithium-class battery cells with stacked electrode assemblies having in-stack sensor arrays. An electrochemical device includes a device housing that stores an electrolyte composition for conducting ions. An electrode stack, which is located inside the device housing in electrochemical contact with the electrolyte, includes at least two working electrodes. An electrically insulating and ionically transmissive separator is interposed between each neighboring pair of working electrodes. A reference electrode is attached to one side of the separator and connected to multiple electrical sensing devices. Multiple electrical sensing leads are attached to another side of the separator, opposite the reference electrode, with each abutting a discrete region of a working electrode and each connecting to one of the sensing devices to transmit thereto electrical signals indicative of an electrical characteristic (e.g., voltage) of the discrete region it contacts.

20 Claims, 3 Drawing Sheets

(51) Int. Cl.
  *H01M 10/48* (2006.01)
  *H01M 50/46* (2021.01)
  *B60K 6/26* (2007.10)
  *B60K 6/28* (2007.10)

(52) U.S. Cl.
  CPC ....... *B60Y 2200/91* (2013.01); *B60Y 2200/92* (2013.01); *B60Y 2400/112* (2013.01)

(56) References Cited

U.S. PATENT DOCUMENTS

| | | |
|---|---|---|
| 8,565,949 B2 | 10/2013 | Christman et al. |
| 8,586,222 B2 | 11/2013 | Timmons et al. |
| 9,028,565 B2 | 5/2015 | Huang |
| 9,142,830 B2 | 9/2015 | Xiao et al. |
| 9,142,980 B2 | 9/2015 | Lee |
| 9,281,514 B2 | 3/2016 | Rhodes et al. |
| 9,379,418 B2 | 6/2016 | Wang et al. |
| 9,660,462 B2 | 5/2017 | Jeon |
| 9,923,189 B2 | 3/2018 | Xiao |
| 10,062,898 B2 | 8/2018 | Xiao |
| 10,199,643 B2 | 2/2019 | Zhou et al. |
| 10,367,201 B2 | 7/2019 | Yang et al. |
| 10,388,959 B2 | 8/2019 | Dong et al. |
| 10,424,784 B2 | 9/2019 | Yang et al. |
| 10,435,773 B2 | 10/2019 | Liu et al. |
| 10,446,884 B2 | 10/2019 | Yang et al. |
| 10,511,049 B2 | 12/2019 | Yang et al. |
| 10,566,652 B2 | 2/2020 | Dai et al. |
| 10,573,879 B2 | 2/2020 | Yang et al. |
| 10,593,988 B2 | 3/2020 | Xiao et al. |
| 10,629,941 B2 | 4/2020 | Dai et al. |
| 10,637,048 B2 | 4/2020 | Qi et al. |
| 10,673,046 B2 | 6/2020 | Dadheech et al. |
| 2009/0104510 A1* | 4/2009 | Fulop .................. H01M 50/553 429/50 |
| 2011/0215767 A1 | 9/2011 | Johnson et al. |
| 2011/0248675 A1 | 10/2011 | Shiu et al. |
| 2012/0206296 A1 | 8/2012 | Wan |
| 2013/0119935 A1 | 5/2013 | Sufrin-Disler et al. |
| 2014/0152232 A1 | 6/2014 | Johnson et al. |
| 2018/0151922 A1* | 5/2018 | Ito ....................... H01M 50/176 |
| 2019/0280333 A1 | 9/2019 | Dahn et al. |
| 2019/0280334 A1 | 9/2019 | Dahn et al. |
| 2019/0393546 A1 | 12/2019 | Dahn et al. |
| 2021/0091369 A1 | 3/2021 | Dadheech et al. |
| 2021/0091424 A1 | 3/2021 | Gao et al. |
| 2021/0218006 A1 | 7/2021 | Gao et al. |

\* cited by examiner

ELECTROCHEMICAL SYSTEMS, METHODS, AND DEVICES USING STACKED ELECTRODE ASSEMBLIES WITH IN-STACK SENSOR ARRAYS

INTRODUCTION

The present disclosure relates generally to electrochemical devices. More specifically, aspects of this disclosure relate to stacked electrode assemblies with an in-stack sensor for cylindrical, pouch, and prismatic lithium-class battery cells.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving torque through an automatic or manually shifted power transmission to the vehicle's final drive system (e.g., differential, axle shafts, corner modules, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid-electric and full-electric (collectively "electric-drive") vehicles, on the other hand, utilize alternative power sources to propel the vehicle and, thus, minimize or eliminate reliance on a fossil-fuel based engine for tractive power.

A full-electric vehicle (FEV)—colloquially labeled an "electric car"—is a type of electric-drive vehicle configuration that altogether omits the internal combustion engine and attendant peripheral components from the powertrain system, relying on a rechargeable energy storage system (RESS) and a traction motor for vehicle propulsion. The engine assembly, fuel supply system, and exhaust system of an ICE-based vehicle are replaced with a single or multiple traction motors, a traction battery pack, and battery cooling and charging hardware in a battery-based FEV. Hybrid-electric vehicle (HEV) powertrains, in contrast, employ multiple sources of tractive power to propel the vehicle, most commonly operating an internal combustion engine assembly in conjunction with a battery-powered or fuel-cell-powered traction motor. Since hybrid-type, electric-drive vehicles are able to derive their power from sources other than the engine, HEV engines may be turned off, in whole or in part, while the vehicle is propelled by the electric motor(s).

Many commercially available hybrid-electric and full-electric vehicles employ a rechargeable traction battery pack to store and supply the requisite power for operating the powertrain's traction motor unit(s). In order to generate tractive power with sufficient vehicle range and speed, a traction battery pack is significantly larger, more powerful, and higher in capacity (Amp-hr) than a standard 12-volt starting, lighting, and ignition (SLI) battery. Contemporary traction battery packs, for example, group stacks of battery cells (e.g., 8-16+ cells/stack) into individual battery modules (e.g., 10-40+ modules/pack) that are mounted onto the vehicle chassis by a battery pack housing or support tray. Stacked electrochemical battery cells may be connected in series or parallel through use of an electrical interconnect board (ICB) or front-end DC bus bar assembly. A dedicated Electronic Battery Control Module (EBCM), through collaborative operation with a Powertrain Control Module (PCM) and Traction Power Inverter Module (TPIM), regulates the opening and closing of battery pack contactors to govern operation of the battery pack.

There are four primary types of batteries that are used in electric-drive vehicles: lithium-class batteries, nickel-metal hydride batteries, ultracapacitor batteries, and lead-acid batteries. As per lithium-class designs, lithium-metal (primary) batteries and lithium-ion (secondary) batteries make up the bulk of commercial lithium battery (LiB) configurations with Li-ion variants being employed in automotive applications due to their enhanced stability, energy density, and rechargeable capabilities. A standard lithium-ion (Li-ion) cell is generally composed to at least two conductive electrodes, an electrolyte material, and a permeable separator, all of which are enclosed inside an electrically insulated packaging. One electrode serves as a positive ("cathode") electrode and the other electrode serves as a negative ("anode") electrode during cell discharge. Rechargeable Li-ion batteries operate by reversibly passing lithium ions back and forth between these working electrodes. The separator-oftentimes a microporous polymeric membrane—is disposed between the two electrodes to prevent electrical short circuits while also allowing the transport of ionic charge carriers. The electrolyte is suitable for conducting lithium (Li) ions and may be in solid form (e.g., solid state diffusion), liquid form (e.g., liquid phase diffusion), or quasi-solid form (e.g., solid electrolyte entrained within a liquid carrier). Ions move from the negative electrode, through a connected circuit, to the positive electrode during discharge of the battery while under load, and in the opposite direction when recharging the battery.

SUMMARY

Presented herein are electrochemical devices with in-stack sensor arrays, methods for manufacturing and methods for operating such electrochemical devices, and lithium-class battery cells with stacked electrode assemblies having a distributed array of sensors within the stack. By way of example, a pouch-type lithium-ion battery cell contains an electrode stack with a succession of anode electrodes interleaved with a corresponding number of cathode electrodes. An electrically insulating and ionically conductive separator, which may be in the nature of a polymeric separator sheet immersed in liquid electrolyte or bonded to solid electrolyte, is disposed between each pair of neighboring electrodes. One side of the separator is fitted with a predefined pattern of discrete voltage sensing leads, each of which electrically connects to a respective voltage sensor. Fixed to the opposite side of the separator is an electrically conductive reference electrode, which may be coterminous in area with the major face of the separator to which the reference electrode is mounted. A reference electrode current collector may be sandwiched between the reference electrode and separator for electrically connecting the reference electrode to the voltage sensors. The voltage sensing leads and reference electrode cooperatively transmit electrical signals to the voltage sensors to determine electrode voltages at various location on a single electrode. Optionally, the same reference electrode may operatively connect with one or more voltage sensing leads located at different layers throughout the stack to take voltage sensor readings at select regions of multiple electrodes.

Attendant benefits for at least some of the disclosed concepts include stacked electrode architectures with in-stack arrays of sensing devices for in situ evaluation of electrode operating characteristics. In addition, proposed sensor arrangements may enable more efficient direct-current fast charging (DCFC) and regenerative calibration control with a higher level of accuracy through comprehensive mapping of real-time electrode voltages. Other attendant benefits may include the ability to detect and evaluate micro short circuits (MSC) at discrete locations within a cell by monitoring electrode balance. Proposed in-stack sensor arrays may also sense in-cell temperature gradients and non-uniform electrode aging/plating due to their effects on in-plane local potential. In addition to improved electrode monitoring and charging capabilities, disclosed concepts may help to increase driving range, fuel economy, and pack performance for electric-drive vehicles.

Aspects of this disclosure are directed to electrochemical devices, such as cylindrical, pouch, and prismatic LiB cells, e.g., used in the battery modules of vehicular traction battery packs. In an example, an electrochemical device includes a device housing that contains an electrolyte composition that is chemically configured to conduct ions. An electrode stack, which is located inside the device housing in electrochemical contact with the electrolyte, includes one or more first (e.g., anode) working electrodes interleaved with one or more second (e.g., cathode) working electrodes. An electrically insulating separator is interposed between each neighboring pair of working electrodes. These separators physically separate the neighboring electrodes while transmitting therebetween the electrolyte ions. A set of resident or remote electrical sensing devices detect one or more operating characteristics of the electrodes (e.g., voltage, current, cell potential, half-cell voltage, etc.). A reference electrode is attached to one side of a separator and connected to the electrical sensing devices. Multiple electrical sensing leads (e.g., voltage sensing layer(s)) are attached in-plane to a single separator, on a side opposite the reference electrode, or are attached to multiple separators at distinct layers throughout the stack. Each sensing lead abuts a discrete region of a working electrode and connects to a respective sensing device to transmit thereto one or more electrical signals indicative of an electrical characteristic of the discrete region to which it abuts.

Additional aspects of this disclosure are directed to lithium-class battery cells with stacked electrode assemblies having in-stack arrays of sensors, rechargeable battery packs employing such lithium-class battery cells, and motor vehicles equipped with such battery packs. As used herein, the terms "vehicle" and "motor vehicle" may be used interchangeably and synonymously to include any relevant vehicle platform, such as passenger vehicles (ICE, HEV, FEV, fuel cell, fully and partially autonomous, etc.), commercial vehicles, industrial vehicles, tracked vehicles, off-road and all-terrain vehicles (ATV), motorcycles, farm equipment, watercraft, aircraft, e-bikes, e-scooters, etc. For non-automotive applications, disclosed concepts may be implemented for any logically relevant use, including stand-alone power stations and portable power packs, photovoltaic systems, handheld electronic devices, pumping equipment, machine tools, appliances, etc. While not per se limited, disclosed concepts may be particularly advantageous for use in lithium-metal cylindrical, pouch, and prismatic can cells.

In an example, a motor vehicle includes a vehicle body with a passenger compartment, multiple road wheels rotatably mounted to the vehicle body (e.g., via corner modules coupled to a unibody or body-on-frame chassis), and other standard original equipment. For electric-drive vehicle applications, one or more electric traction motors operate alone (e.g., for FEV powertrains) or in conjunction with an internal combustion engine assembly (e.g., for HEV powertrains) to selectively drive one or more of the road wheels to propel the vehicle. A rechargeable traction battery pack is mounted onto the vehicle body and operable to power the traction motor(s).

Continuing with the discussion of the preceding example, the traction battery pack contains multiple lithium-class battery cells, e.g., stacked within one or more battery modules. Each battery cell is fabricated with a protective battery housing that stores therein a liquid, solid, or quasi-solid electrolyte composition for conducting ions. An electrode stack is located inside the battery housing in electrochemical contact with the electrolyte. The electrode stack includes a series of anode working electrodes that is interleaved with a corresponding number of a cathode working electrodes. An electrically insulating separator is interposed between each neighboring pair of working electrodes; the separator transmits therethrough the ions of the electrolyte.

Also located inside the battery housing is one or more reference electrodes, each of which is mounted to a respective one of the separators. A reference current collector is sandwiched between each mating reference electrode and separator; the current collector electrically connects the reference electrode to a set of electrical voltage sensing devices, which may be packaged in or on or remote from the device housing. Multiple voltage sensing leads are attached to a single one or select ones of the separators. Each sensing lead abuts a respective region of a working electrode and operatively connects to a respective one of the voltage sensing devices to transmit thereto one or more electrical signals indicative of a real-time voltage of the discrete region to which it abuts. The voltage sensing leads may be formed as electrically conductive and ionically permeable pads.

Aspects of this disclosure are also directed to manufacturing processes, control logic, and computer-readable media (CRM) for making and/or using any of the disclosed electrochemical devices, battery packs, and/or vehicles. In an example, a method is presented for assembling an electrochemical device. This representative method includes, in any order and in any combination with any of the above and below disclosed options and features: receiving a device housing of the electrochemical device; locating an electrolyte inside the device housing, the electrolyte being configured to conduct ions; locating an electrode stack inside the device housing in electrochemical contact with the electrolyte, the electrode stack including first and second working electrodes; locating an electrically insulating separator between the first and second working electrodes, the separator being configured to transmit therethrough the ions of the electrolyte; receiving a plurality of electrical sensing devices operable to detect electrode characteristics; attaching a reference electrode to a first side of the separator; connecting the reference electrode to the plurality of electrical sensing devices; attaching a plurality of electrical sensing leads to a second side of the separator, opposite the first side, such that each of the electrical sensing leads abuts a respective discrete region of the first working electrode; and connecting each of the electrical sensing leads to a respective one of the sensing devices to transmit thereto an electrical signal indicative of an electrical characteristic of the discrete region to which it abuts. The herein-described method steps may be performed manually (e.g., by an operator), may be automated (e.g., by a robotic cell), or a combination of both.

For any of the disclosed devices, vehicles, and methods, the electrode stack may contain multiple first working electrodes interleaved with multiple second working electrodes. Likewise, the electrode stack may contain multiple electrically insulating separators each sandwiched between a respective neighboring pair of the working electrodes. For at least some applications, multiple electrical sensing leads are mounted in a distributed array to a shared or "common" separator and all physically contact a shared/common working electrode. As yet a further option, a first set of one or more electrical sensing leads abuts one of the working electrodes and attaches to one of the separators, whereas a second subset of one or more electrical sensing leads abuts another working electrode and attaches to another separator, and so on for multiple layers within the stack. It may be desirable that multiple subsets of electrical sensing leads located at different layers throughout the stack electrically connect to a common/shared reference electrode and cooperate therewith to transmit electrical signals to the sensing devices. For at least some implementations, the leads mount directly to the separator and have direct physical contact with the electrode being monitored.

For any of the disclosed devices, vehicles, and methods, each of the electrical sensing leads may be electrically connected in series with the reference electrode and a respective one of the electrical sensing devices. As mentioned above, a reference current collector may be sandwiched between each reference electrode and its associated separator; the current collector electrically connects the reference electrode to the sensing devices. In this instance, the reference current collector may be fabricated as a unitary, single-piece construction that is formed, in whole or in part, from an electrically conductive material that is innately porous or fashioned with a predefined minimum porosity. As yet a further option, each reference current collector may have a surface area that is smaller than the surface area of the reference electrode to which it attaches.

For any of the disclosed devices, vehicles, and methods, each reference electrode may be fabricated as a unitary, single-piece construction that is formed, in whole or in part, from an electroactive and conductive material that is innately porous or fashioned with a predefined minimum porosity. The reference electrode may have a surface area that is substantially coterminous with the surface area of the separator to which it attaches. For at least some implementations, the reference electrode is formed as an electrically conductive and ionically permeable electrode film with a reference electrode thickness of about 0.02 micrometers (μm) to about 10.0 μm. Each electrical sensing lead may be formed as an electrically conductive and ionically permeable pad with a lead thickness of approximately 0.01 μm to about 1.0 μm. Similar to the separator, reference electrode, and current collector, the sensing leads are innately porous or fashioned with a predefined minimum porosity.

For any of the disclosed devices, vehicles, and methods, a pattern of electrical wires, traces, or similarly suitable conduits may be fixed to the same side of the separator as the voltage sensing layer. Each electrical wire/trace electrically connects one of the electrical sensing leads to one of the sensing devices. A pattern of electrical wires/traces/conduits may also be fixed to the same side of the separator as the reference electrode layer for electrically connecting the reference electrode to some or all of the sensing devices. The device housing may take on numerous suitable constructions, including a flexible pouch-type outer housing, a rigid prismatic-type outer housing, or a rigid cylindrical-type outer housing.

The above summary does not represent every embodiment or every aspect of this disclosure. Rather, the above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes any and all combinations and subcombinations of the elements and features described above and below.

Figure 1:
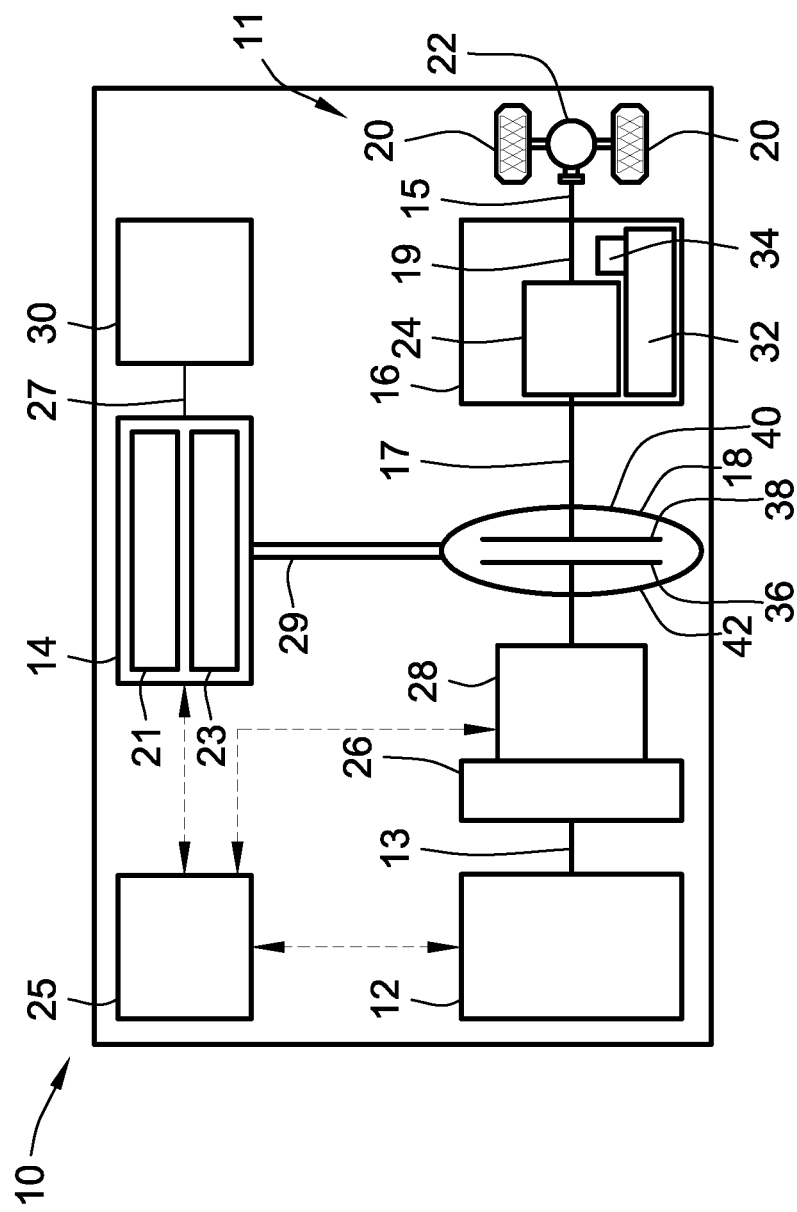
FIG. 1 is a schematic illustration of a representative electric-drive vehicle with a hybrid electric powertrain employing an electric motor/generator unit (MGU) powered by a rechargeable traction battery pack in accord with aspects of the present disclosure.

Representative embodiments of this disclosure are shown by way of non-limiting example in the drawings and are described in additional detail below. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for instance, by the appended claims.

DETAILED DESCRIPTION

This disclosure is susceptible of embodiment in many different forms. Representative examples of the disclosure are shown in the drawings and herein described in detail with the understanding that these embodiments are provided as an exemplification of the disclosed principles, not limitations of the broad aspects of the disclosure. To that end, elements and limitations that are described, for example, in the Abstract, Introduction, Summary, Description of the Drawings, and Detailed Description sections, but not explicitly set forth in the claims, should not be incorporated into the claims, singly or collectively, by implication, inference, or otherwise. Moreover, the drawings discussed herein may not be to scale and are provided purely for instructional purposes. Thus, the specific and relative dimensions shown in the Figures are not to be construed as limiting.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and permutations thereof, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle, when the vehicle is operatively oriented on a horizontal driving surface.

Referring now to the drawings, wherein like reference numbers refer to like features throughout the several views, there is shown in FIG. 1 a schematic illustration of a representative automobile, which is designated generally at 10 and portrayed herein for purposes of discussion as a passenger vehicle with a parallel two-clutch (P2) hybrid-electric powertrain. The illustrated automobile 10—also referred to herein as "motor vehicle" or "vehicle" for short—is merely an exemplary application with which novel aspects of this disclosure may be practiced. In the same vein, implementation of the present concepts into a hybrid electric powertrain should also be appreciated as a representative implementation of the novel concepts disclosed herein. As such, it will be understood that facets of this disclosure may be applied to other powertrain architectures, incorporated into any logically relevant type of motor vehicle, and utilized for both automotive and non-automotive applications alike. Lastly, only select components have been shown and will be described in additional detail herein. Nevertheless, the vehicles and electrochemical devices discussed below may include numerous additional and alternative features, and other available peripheral components and hardware, for carrying out the various methods and functions of this disclosure.

The representative vehicle powertrain system is shown in FIG. 1 with a prime mover-represented herein by a restartable internal combustion engine (ICE) assembly 12 and an electric motor/generator unit (MGU) 14—that drivingly connects to a driveshaft 15 of a final drive system 11 by a multi-speed automatic power transmission 16. The engine 12 transfers power, typically by way of torque via an engine crankshaft 13, to an input side of the transmission 16. Engine torque is first transmitted via the crankshaft 13 to rotate an engine-driven torsional damper assembly 26, and concomitantly transferred through the torsional damper assembly 26 to an engine disconnect device 28. This engine disconnect device 28, when operatively engaged, transmits torque received from the ICE assembly 12, by way of the damper 26, to input structure of the torque converter (TC) assembly 18. As the name implies, the engine disconnect device 28 may be selectively disengaged to drivingly disconnect the ICE 12 from the motor 14, TC assembly 18, and transmission 16.

To propel the hybrid vehicle 10 of FIG. 1, the transmission 16 is adapted to receive, selectively manipulate, and distribute tractive power output from the engine 12 and motor 14 to the vehicle's final drive system 11. The final drive system 11 is represented herein by a driveshaft 15, rear differential 22, and a pair of rear road wheels 20. The power transmission 16 and torque converter 18 of FIG. 1 may share a common transmission oil pan or "sump" 32 for supply of hydraulic fluid. A shared transmission pump 34 provides sufficient hydraulic pressure for the fluid to selectively actuate hydraulically activated elements of the transmission 16, the TC assembly 18 and, for some implementations, the engine disconnect device 28.

The ICE assembly 12 operates to propel the vehicle 10 independently of the electric traction motor 14, e.g., in an "engine-only" operating mode, or in cooperation with the motor 14, e.g., in "vehicle-launch" or "motor-boost" operating modes. In the example depicted in FIG. 1, the ICE assembly 12 may be any available or hereafter developed engine, such as a compression-ignited diesel engine or a spark-ignited gasoline or flex-fuel engine, which is readily adapted to provide its available power output typically at a number of revolutions per minute (RPM). Although not explicitly portrayed in FIG. 1, it should be appreciated that the final drive system 11 may take on any available configuration, including front wheel drive (FWD) layouts, rear wheel drive (RWD) layouts, four-wheel drive (4WD) layouts, all-wheel drive (AWD) layouts, six-by-four (6×4) layouts, etc.

FIG. 1 also depicts an electric motor/generator unit ("motor") 14 that operatively connects via a motor support hub, shaft, or belt 29 to the hydrodynamic torque converter 18. The torque converter 18, in turn, drivingly connects the motor 14 to an input shaft 17 of the transmission 16. The electric motor/generator unit 14 is composed of an annular stator assembly 21 circumscribing and concentric with a cylindrical rotor assembly 23. Electric power is provided to the stator 21 through a high-voltage electrical system, including electrical conductors/cables 27 that pass through the motor housing via suitable sealing and insulating feedthroughs (not illustrated). Conversely, electric power may be provided from the MGU 14 to an onboard traction battery pack 30, e.g., through regenerative braking. Operation of any of the illustrated powertrain components may be governed by an onboard or remote vehicle controller or network of controllers and devices, which is represented in FIG. 1 by a programmable electronic control unit (ECU) 25.

Power transmission 16 may use differential gearing 24 to achieve selectively variable torque and speed ratios between transmission input and output shafts 17 and 19, respectively. One form of differential gearing is the epicyclic planetary gear arrangement, which offers the advantage of compactness and different torque and speed ratios among members of the planetary gearing. Traditionally, hydraulically actuated torque establishing devices, such as clutches and brakes, are selectively engageable to activate the aforementioned gear elements for establishing desired forward and reverse speed ratios between the transmission's input and output shafts 17, 19. While envisioned as a 6-speed or 8-speed automatic transmission, the power transmission 16 may optionally take on other functionally appropriate configurations, including Continuously Variable Transmission (CVT) architectures, automated-manual transmissions, etc.

Hydrodynamic torque converter assembly 18 of FIG. 1 operates as a fluid coupling for operatively connecting the engine 12 and motor 14 with the internal epicyclic gearing 24 of the power transmission 16. Disposed within an internal fluid chamber of the torque converter assembly 18 is a bladed impeller 36 juxtaposed with a bladed turbine 38. The impeller 36 is juxtaposed in serial power-flow fluid communication with the turbine 38, with a stator (not shown) interposed between the impeller 36 and turbine 38 to selectively alter fluid flow therebetween. The transfer of torque from the engine and motor output members 13, 29 to the transmission 16 via the TC assembly 18 is through stirring excitation of hydraulic fluid, such as transmission oil, inside the TC's internal fluid chamber caused by rotation of the impeller and turbine 36, 38 blades. To protect these components, the torque converter assembly 18 is constructed with a TC pump housing, defined principally by a transmission-side pump shell 40 fixedly attached to an engine-side pump cover 42 such that a working hydraulic fluid chamber is formed therebetween.

Vehicle ECU 25 of FIG. 1 incorporates a battery management system (BMS) that employs battery state estimation techniques using an in-stack array of sensors to measure real-time electrode operating characteristics at discrete regions on the surface of select working electrodes within the cell stack. In situ measurement of electrode operating characteristics may help to enhance the system's fast-charging capabilities and improve regenerative calibration, e.g., through comprehensive mapping of real-time anode electrode voltages. Traction battery pack 30 may employ an assemblage of lithium-ion (Li-ion) battery modules arranged in a pattern of rows and columns; a battery support tray may provide subjacent support for the battery modules. Each of the battery modules may contain a collection of lithium-class battery cells, such as prismatic, cylindrical, or pouch-type Li-ion battery cells, for example. For simplification of design and maintenance, as well as to reduce manufacturing cost and time, the modules may be substantially identical to each other. Disclosed concepts are similarly applicable to other rechargeable energy storage system (RESS) architectures, including those employing nickel metal hydride (NiMH) batteries, lead acid batteries, lithium polymer batteries, or other applicable type of rechargeable electric vehicle batteries (EVB).

Figure 2:
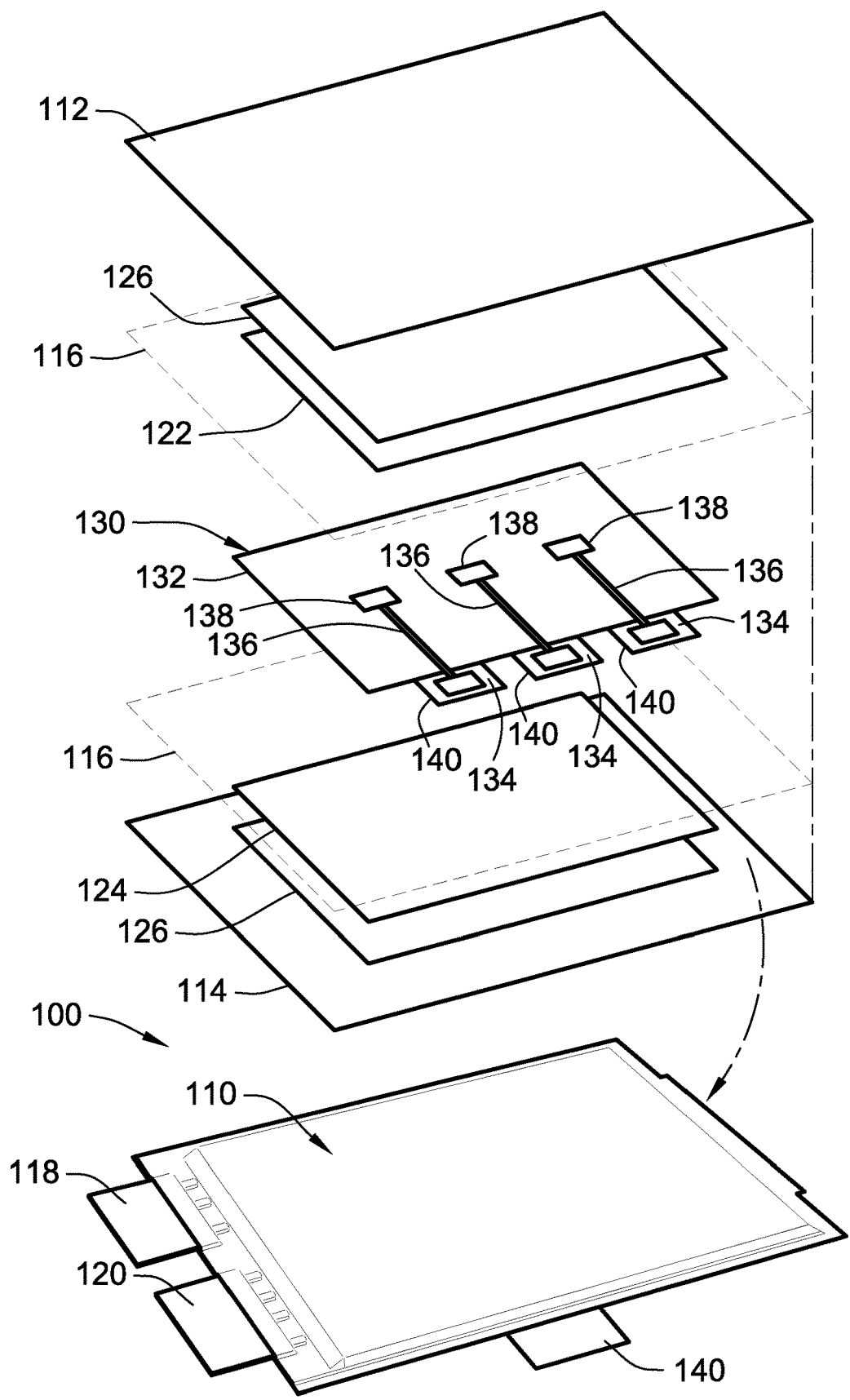
FIG. 2 is a partially exploded, perspective-view illustration of a representative electrochemical device with an electrode stack assembly having an in-stack array of electrical sensing devices in accord with aspects of the disclosed concepts.

An individual lithium-ion battery module may be typified by a single rechargeable battery cell, an example of which is designated generally 100 in FIG. 2, or multiple battery cell assemblies 100 (e.g., 10-20 or more) that are stacked and connected in parallel or series for storing and supplying electrical energy. As shown, each battery cell assembly 100 is a multi-layer construction that is provided with a protective outer housing (or "device housing"), which is represented in the drawings by an envelope-like battery pouch 110. Battery pouch 110 may consist essentially of two generally flat, rectangular casing sides 112 and 114. The casing sides 112, 114 of the pouch 110 may be stamped or cut from aluminum sheet or foil or other suitable material, both sides of which may be coated with a polymeric surface treatment that insulates the metal from the cell elements and from any adjacent cells. These two sides 112, 114 are connected, e.g., via welding or crimping or other appropriate joining technique, to generally enclose therein a liquid electrolyte composition (shown schematically at 116) that conducts positive Lithium ions between the cell's electrodes 122, 124. Extending outwardly from longitudinal edges of the two major sides 112, 114 of pouch 110 are negative and positive tabs 118 and 120, respectively, for making electrical connections with negative and positive electrodes of an electrode stack assembly packaged within the internal volume of pouch 110. While shown as a silicon-based, Li-ion "pouch cell" battery, the battery cell assemblies 100 may be adapted to other constructions, including cylindrical and prismatic constructions.

Pouch 110 is shaped and sized to store therein a single unit or a stack of repeated units of lithium-ion cell components, with a unit generally composed of a first working (anode) electrode 122 layer, a second working (cathode) electrode 124 layer, and a series of separator sheets 126 interleaved between each electrode 122, 124 and the major sides 112, 114 of the battery pouch 110 (as shown) and, optionally, between neighboring anode and cathode electrodes 122, 124 (e.g., separator 132). Although FIG. 2 illustrates only one unit of cell components inserted within the pouch 110, it should be appreciated that the pouch 110 may stow therein a sandwiched stack of multiple cell component units (e.g., five to fifteen units or more). The anode electrode 122 and cathode electrode 124 may be encased within the pouch 110 and placed in electrochemical contact with the electrolyte composition 116 layer(s) such that ions are transferable therebetween. Reference to the first working electrode 122 as an "anode" or "anode electrode" or "negative electrode" is not intended to limit the first working electrode 122 to a particular polarity as the designation of a particular electrode as anode or cathode may change depending on how the battery cell assembly 100 is being operated (e.g., whether the process is oxidation or reduction). In the same vein, any reference to the second working electrode 124 as a "cathode" or "cathode electrode" or "positive electrode" should not be construed as limiting the second working electrode 124 to a particular polarity or functionality.

With continuing reference to FIG. 2, anode electrode 122 may be fabricated with an active anode electrode material that is capable of incorporating lithium ions during a battery charging operation and releasing lithium ions during a battery discharging operation. In at least some implementations, the anode electrode 122 is manufactured, in whole or in part, from a lithium metal, such as lithium-aluminum (LiAl) alloy materials with an Li/Al atomic ratio in a range from 0 at. %≤Li/Al<70 at. %, and/or aluminum alloys with Al atomic ratio >50 at. % (e.g., lithium metal is smelt). Additional examples of suitable active anode electrode materials include carbonaceous materials (e.g., graphite, hard carbon, soft carbon etc.), silicon, silicon-carbon blended materials (silicon-graphite composite), $Li_4Ti_5O_{12}$, transition-metals (alloy types, e.g., Sn), metal oxide/sulfides (e.g., $SnO_2$, FeS and the like), etc. In this regard, the cathode electrode 124 may be fabricated with an active cathode electrode material that is capable of supplying lithium ions during a battery charging operation and incorporating lithium ions during a battery discharging operation. The cathode 124 material may include, for instance, lithium transition metal oxide, phosphate, or silicate, such as $LiMO_2$ (M=Co, Ni, Mn, or combinations thereof); $LiM_2O_4$ (M=Mn, Ti, or combinations thereof), $LiMPO_4$ (M=Fe, Mn, Co, or combinations thereof), and $LiM_xM'_{2-x}O_4$ (M, M'=Mn or Ni). Additional examples of suitable active cathode electrode materials include lithium nickel cobalt manganese oxide (NCM), lithium nickel cobalt aluminum oxide (NCA), lithium nickel cobalt manganese aluminum oxide (NCMA), and other lithium transition-metal oxides.

Disposed inside the battery housing 110 between each electrode 122, 124 and its neighboring casing side 112 and 114 is a separator 126, which may each be in the nature of a microporous or nanoporous polymeric sheet. These porous separators 126 may include a non-aqueous fluid electrolyte composition and/or a solid electrolyte composition, collectively designated 116, which may also be present in metered quantity within the active materials of the negative electrode 122 and the positive electrode 124. Each separator 126 layer may be a sheet-like structure that is composed of a porous polyolefin membrane, e.g., with a porosity of about 35% to 65% and a thickness of approximately 10-30 microns. Electrically non-conductive ceramic particles (e.g., silica) may be coated onto the porous membrane surfaces of the separators 126.

Inserted into the electrode stack between the anode electrode 122 and the cathode electrode 124 is an in-stack electrode sensor assembly 130 that is likewise placed in electrochemical contact with the electrolyte composition 116. As shown, the electrode sensor assembly 130 functions as a set of "non-working" electrodes that independently measure, for example, voltage, current, or other desired operating characteristic(s) at discrete locations on the surface of the anode or cathode electrode 122, 124. The representative electrode sensor assembly 130 of FIG. 2 is fabricated with a separator sheet 132 layer that supports thereon a voltage sensing layer with three discretely located electrical sensing leads, namely three electrical contacts 134, three electrical tracks 136, and three electrical leads 138. Electrode sensor assembly 130 may include greater or fewer than three electrical sensing leads, which may be arranged in similar or alternative patterns from that shown in FIG. 2. In the same vein, the battery cell 100 may employ a single electrode sensor assembly 130 that monitors a single electrode within a single layer of the electrode stack, as shown, or may employ a single or multiple electrode sensor assemblies to monitor numerous electrodes at various layers within the electrode stack, as described below with respect to FIGS. 3-5.

The dedicated separator sheet 132 of FIG. 2, which provides electrical separation of and ionic conductivity between the electrodes 122, 124, may be formed as a single-piece structure from a thin microporous membrane, such as those described above with respect to the separators 126. For instance, the separator sheet 132 may be fabricated from an electrically insulating, porous polymeric material, such as a single layer or a multi-layer laminate construction of polyethylene (PE) or polypropylene (PP) or a combination of both. As yet a further option, the separator 132 may be a fibrous membrane having a predefined minimum number of through-holes or pores that extend between the separator's opposing major faces and may have a thickness of less than a millimeter, for example. The separator 132 and the other constituent parts of the electrode sensor assembly 130 may be fabricated with an optimal porosity, e.g., approximately equal to or greater than a porosity of a pristine separator, that will not impede ion flux between the anode and cathode electrodes 122, 124. The separator sheet 132 may be interposed in face-to-face non-contacting relation between parallel faces of the anode and cathode layers 122, 124, with the lithium ion-containing, liquid electrolyte solution 116 permeating and filling the pores and contacting the surfaces of the sheet 132.

To measure electrode characteristics in real-time or near real-time at discrete regions on an electrode's surface, the electrode sensor assembly 130 places multiple electrical leads 138 at predefined locations on the separator sheet 132 and into direct physical contact with the electrode under inquiry. The electrical contacts 134, electrical tracks 136, and electrical leads 138 may be fabricated using any suitable method, including etching, sputtering, inkjet, spraying, thin-film deposition, other microfabrication and coating methods, etc. Moreover, the contacts 134, tracks 136, and leads 138 may be formed from a variety of electrically conductive material, such as gold, copper, silver, nickel, stainless steel, carbon cloth, and conductive materials that are stable with respect to the potential of the electrode, which may be mixed with a suitable polymeric binder material. When measuring voltage, the contacts, tracks, and leads 134, 136, 138 may be sufficiently small (e.g., approximately 25-200 nm thick) so as to only draw an insignificant amount of current and to help ensure a minimal effect on the mating of the cell layers. In accord with the illustrated example, three support tabs 140 project transversely from a lateral edge of the elongated separator sheet 132; each electrical contact 134 is deposited on or otherwise affixed to a respective support tab 140. The electrical track 136 electrically connects the electrical lead 138 to the contact 134.

Figure 3:
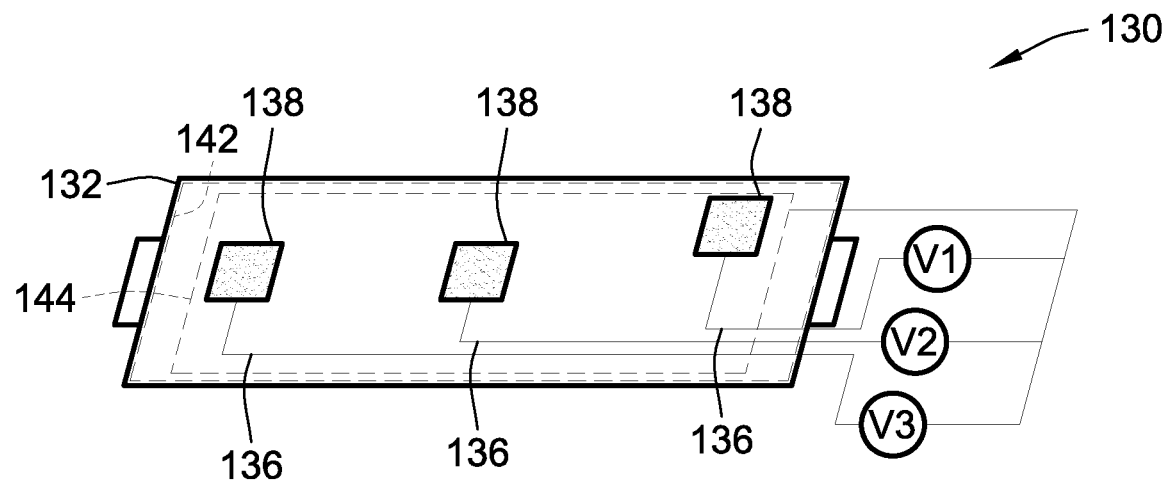
FIG. 3 is a schematic, perspective-view illustration of a representative in-stack electrode sensor assembly of the electrochemical device of FIG. 2.
Figure 4:
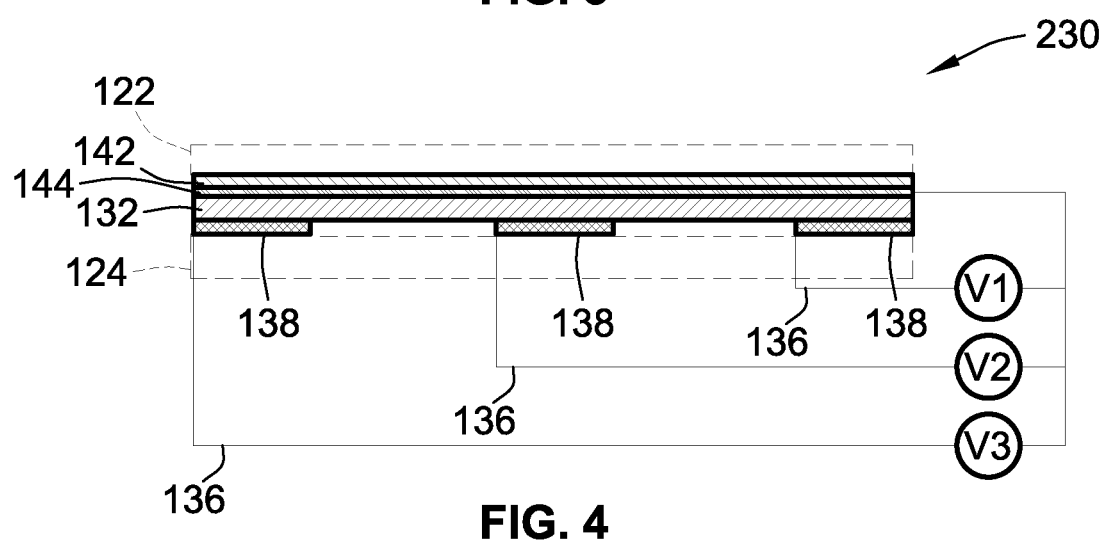
FIG. 4 is a schematic, side-view illustration of the representative electrode sensor assembly and working electrodes of the electrochemical device of FIG. 2.
Figure 5:
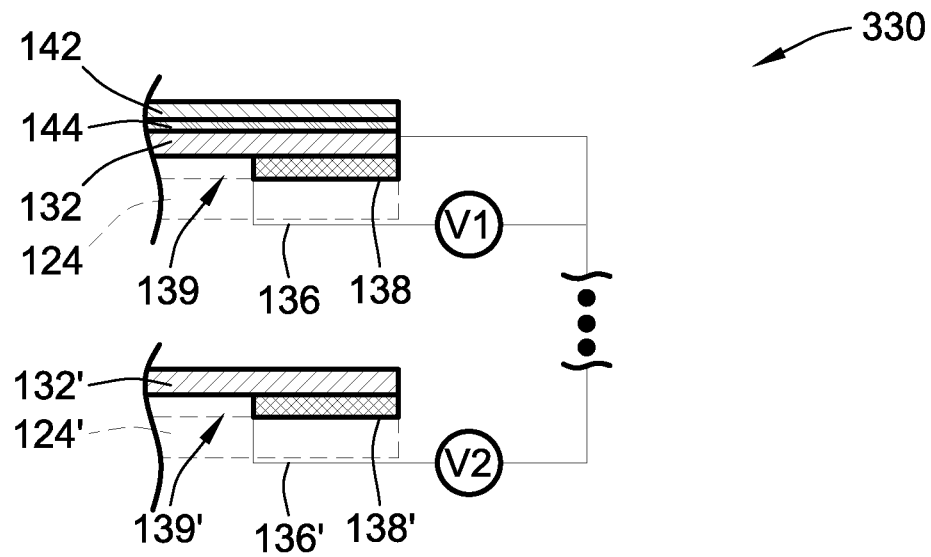
FIG. 5 is a schematic, side-view illustration of another representative electrochemical device with an electrode stack assembly having an in-stack array of electrical sensing devices in accord with aspects of the disclosed concepts.

Turning next to FIGS. 3 and 4, there are shown schematic illustrations of the electrode sensor assembly 130 of FIG. 2. Like FIG. 2, FIG. 3 shows all of the electrical leads 138 located on a top major face of the separator sheet 132 to adjoin a bottom major face of the anode electrode 122. FIG. 4, on the other hand, illustrates an alternative example in which all of the electrical leads 138 of an electrode sensor assembly 230 are mounted underneath the separator sheet 132 to a bottom major face thereof to adjoin a top major face of the cathode electrode 124. By way of comparison, FIG. 5 illustrates a further option in which one subset 139 of electrical sensing leads 138 abuts one "shared" working electrode 124 and mounts to one "shared" separator 132, whereas another subset 139' of electrical sensing leads 138' abuts another "shared" working electrode 124' and mounts to another "shared" separator 132'. It is within the scope of this disclosure that a single electrochemical device, such as rechargeable battery cell 100 of FIG. 2, may employ one or some or all of the in-stack sensor array architectures presented in FIGS. 3-5.

To provide a stable potential for controlled monitoring and measurement of working electrode potential, a reference electrode 142 layer is mounted to the separator sheet 132 layer on a side thereof opposite that of the electrical leads 138. A current collector layer 144 may be disposed between the reference electrode 142 and the separator 132 such that the current collector 144 is in electrical communication with the reference electrode 142. Alternatively, the current collector 144 may be disposed on top of the reference electrode 142 layer. In this configuration, the current collector 144 adjoins the reference electrode 142 and the separator sheet 132, whereas the reference electrode 142 adjoins the current collector 144 and either the cathode electrode 124 (FIGS. 2 and 3) or the anode electrode 122 (FIG. 4). The current collector 144 functions to electrically connect the reference electrode 142 in series with multiple electrical sensing devices, portrayed in FIGS. 3-5 as three discrete voltage sensors V1-V3. Each of the electrical leads 138 is electrically connected in series via their respective electrical contact 134 and track 136 to one of the voltage sensors V1-V3.

The reference electrode 142 is a porous or otherwise permeable structure that allows ions to pass therethrough during cycling of the battery cell assembly 100. In certain aspects, the reference electrode 142 may have a total porosity (i.e., percentage of void space in solid mass) of at least about 30% or, in some implementations, approximately 40-80%. It may also be desirable that a porosity of the reference electrode 142 is equal to or greater than a porosity of the separator sheet 132 to help ensure that the reference electrode 142 does not create an unintentional barrier to ion flux. In addition, the reference electrode 142 may cover some or all of a major face of the separator sheet 132 (e.g., separator's upwardly facing surface of FIG. 4) and some or all of a major face of the current collector 144 (e.g., collector's upwardly facing surface of FIG. 4). For instance, the reference electrode 142 may cover at least about 70% of the corresponding faces of the separator sheet 132 and the current collector 144 or, in some implementations, about 90-100% of the mating major face of the current collector 144 and about 65-95% of the mating major face of the separator 132. In accord with the illustrated example, a plan-view surface area of the reference electrode 142 is greater than a plan-view surface area of the current collector 144 and coterminous with a plan-view surface area of the separator sheet 132.

The reference electrode 142 may also be fabricated as a thin film of electroactive material. By way of example, the reference electrode 142 may have a thickness of about 10 μm or less or, in some configurations, a thickness of about 0.2 μm to about 5 μm. Additionally, the reference electrode 142 may be formed with electroactive material particles, a binder, and optionally, a conductive additive. The electroactive material may include a material having a constant or substantially constant voltage regardless of state of charge, e.g., in an operative condition. In certain aspects, the electroactive material may include iron phosphate, lithium titanate, lithium aluminum, or a metal oxide, or any combination thereof. The reference electrode 142 may be manufactured as a unitary, single-piece construction that is formed, in whole or in part, from an electroactive and porous material.

The reference current collector 144 layer is portrayed in FIGS. 3 and 4 as a unitary, single-piece construction that is formed, in whole or in part, from an electrically conductive and porous material. For instance, the reference current collector 144 may be fabricated as a thin copper, nickel, aluminum or carbon foil with a predefined pattern of through-holes. The reference current collector 144 collects and moves free electrons to and from an external circuit. As shown, three voltage sensors V1-V3, which may be in the nature of meters, cyclers, potentiostats, etc., are electrically connected to the reference electrode 142 via the reference current collector 144 to detect a potential difference between a working electrode and the reference electrode 130. Because the system-calibrated operating characteristics of the reference electrode 142 are predetermined, measurement by a resident or remote voltage sensor V1-V3 ultimately provides individual potentials at discrete regions across the electrode surface.

As noted above, each of the electrical sensing leads 138 abuts an isolated region on a major face of the working electrode being monitored. Through cooperative operation with the reference electrode 142 and current collector layer 144, the leads 138 operatively connect to respective sensing devices V1-V3 to transmit thereto one or more electrical signals indicative of a desired electrical characteristic of the discrete region to which that lead 138 abuts. As shown, a first electrical sensing lead (e.g., rightmost lead 138 in FIG. 4) is electrically connected in series with the reference electrode 142 and a first voltage sensor V1, whereas a second electrical sensing lead (e.g., centermost lead 138 in FIG. 4) is electrically connected in series with the reference electrode 142 and a second voltage sensor V2, and a third electrical sensing lead (e.g., leftmost lead 138 in FIG. 4) is electrically connected in series with the reference electrode 142 and a third voltage sensor V2. By way of comparison, both subsets 139, 139' of electrical sensing leads 138, 138' of electrode sensor assembly 330 in FIG. 5 electrically connect via electrical tracks 136, 136' to the same reference electrode 142 and cooperate therewith to transmit electrical signals to distinct sensing devices V1 and V2. Each electrical sensing lead 138 may be fabricated into a single-piece construction as an electrically conductive and ionically permeable pad or a thin film with a thickness of approximately 0.01 micrometers (μm) to about 1.0 μm.

Employing an in-stack sensor array, such as electrode sensor assembly 130, allows for the collection of voltage signals at various locations on the surface of a single electrode or at various locations on the surfaces of multiple electrodes while the electrochemical device is in operation. The collected voltage sensor signals may be used as physical-based inputs for system modelling, controls, diagnostics, and/or VDDV (Virtual Design, Development & Validation) calibration. As noted above, all of the layers in the electrode sensor assembly 130—separator sheet 132 layer, voltage sensing layer leads 138, reference electrode 142 layer, and current collector 144 layer—are porous and permeable (e.g., with a porosity of about 30-80%) so as to not impede electrolyte ion flow.

Aspects of this disclosure may be implemented, in some embodiments, through a computer-executable program of instructions, such as program modules, generally referred to as software applications or application programs executed by any of a controller or the controller variations described herein. Software may include, in non-limiting examples, routines, programs, objects, components, and data structures that perform particular tasks or implement particular data types. The software may form an interface to allow a computer to react according to a source of input. The software may also cooperate with other code segments to initiate a variety of tasks in response to data received in conjunction with the source of the received data. The software may be stored on any of a variety of memory media, such as CD-ROM, magnetic disk, and semiconductor memory (e.g., various types of RAM or ROM).

Moreover, aspects of the present disclosure may be practiced with a variety of computer-system and computer-network configurations, including multiprocessor systems, microprocessor-based or programmable-consumer electronics, minicomputers, mainframe computers, and the like. In addition, aspects of the present disclosure may be practiced in distributed-computing environments where tasks are performed by resident and remote-processing devices that are linked through a communications network. In a distributed-computing environment, program modules may be located in both local and remote computer-storage media including memory storage devices. Aspects of the present disclosure may therefore be implemented in connection with various hardware, software, or a combination thereof, in a computer system or other processing system.

Any of the methods described herein may include machine readable instructions for execution by: (a) a processor, (b) a controller, and/or (c) any other suitable processing device. Any algorithm, software, control logic, protocol or method disclosed herein may be embodied as software stored on a tangible medium such as, for example, a flash memory, a solid-state drive (SSD) memory, a hard-disk drive (HDD) memory, a CD-ROM, a digital versatile disk (DVD), or other memory devices. The entire algorithm, control logic, protocol, or method, and/or parts thereof, may alternatively be executed by a device other than a controller and/or embodied in firmware or dedicated hardware in an available manner (e.g., implemented by an application specific integrated circuit (ASIC), a programmable logic device (PLD), a field programmable logic device (FPLD), discrete logic, etc.). Further, although specific algorithms may be described with reference to flowcharts and/or workflow diagrams depicted herein, many other methods for implementing the example machine-readable instructions may alternatively be used.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed is:

1. An electrochemical device, comprising:
a device housing;
an electrolyte located inside the device housing and configured to conduct ions;
an electrode stack located inside the device housing and including first and second working electrodes in electrochemical contact with the electrolyte;
an electrically insulating separator interposed between the first and second working electrodes, the separator being configured to transmit therethrough the ions of the electrolyte;
a plurality of electrical sensing devices configured to detect electrode characteristics;
a reference electrode mounted onto a first face of the separator, abutting the second working electrode, and electrically connected to the plurality of electrical sensing devices; and
a plurality of electrical sensing leads each abutting a respective discrete region of the first working electrode, each mounted onto a second face of the separator, opposite the first face, and each electrically connected to a respective one of the electrical sensing devices to transmit thereto an electrical signal indicative of an electrical characteristic of the discrete region to which it abuts.

2. The electrochemical device of claim 1, wherein the electrode stack includes a plurality of the first working electrodes interleaved with a plurality of the second working electrodes, and wherein the separator includes a plurality of electrically insulating separators each sandwiched between a respective neighboring pair of the first and second working electrodes.

3. The electrochemical device of claim 2, wherein the electrical sensing leads all abut a common one of the first working electrodes and all attach to a common one of the separators.

4. The electrochemical device of claim 2, wherein a first subset of the electrical sensing leads abuts a first one of the first working electrodes and attaches to a first one of the separators, and a second subset of the electrical sensing leads abuts a second one of the first working electrodes and attaches to a second one of the separators.

5. The electrochemical device of claim 4, wherein both the first and second subsets of the electrical sensing leads electrically connect to the reference electrode and cooperate therewith to transmit electrical signals to the electrical sensing devices.

6. The electrochemical device of claim 1, wherein a first of the electrical sensing leads is electrically connected in series with the reference electrode and a first of the electrical sensing devices, and a second of the electrical sensing leads is electrically connected in series with the reference electrode and a second of the electrical sensing devices.

7. The electrochemical device of claim 1, further comprising a reference current collector sandwiched between the reference electrode and the separator and electrically connecting the reference electrode to the plurality of electrical sensing devices.

8. The electrochemical device of claim 7, wherein the reference current collector is a single-piece construction formed with an electrically conductive material and having a collector surface area smaller than a reference surface area of the reference electrode.

9. The electrochemical device of claim 1, wherein the reference electrode is a single-piece construction formed with an electroactive material and having a reference surface area substantially coterminous with a separator surface area of the first side of the separator.

10. The electrochemical device of claim 1, wherein the reference electrode is formed with an electrically conductive and ionically permeable electrode film with a reference electrode thickness of about 0.02 micrometers ($\mu$m) to about 5.0 $\mu$m.

11. The electrochemical device of claim 1, wherein each of the electrical sensing leads is formed with an electrically conductive and ionically permeable pad with a lead thickness of approximately 0.01 micrometers ($\mu$m) to about 1.0 $\mu$m.

12. The electrochemical device of claim 1, further comprising a plurality of electrical wires or traces fixed to the second face of the separator and each electrically connecting a respective one of the electrical sensing leads to a respective one of the electrical sensing devices.

13. The electrochemical device of claim 1, wherein the device housing includes a flexible pouch-type outer housing, a rigid prismatic-type outer housing, or a rigid cylindrical-type outer housing.

14. An electric-drive vehicle, comprising:
a vehicle body;
a plurality of road wheels attached to the vehicle body;
a traction motor attached to the vehicle body and operable to drive one or more of the road wheels to thereby propel the electric-drive vehicle; and
a traction battery pack attached to the vehicle body and operable to power the traction motor, the traction battery pack containing a plurality of lithium-class battery cells, each of the lithium-class battery cells including:
a battery housing;
an electrolyte located inside the battery housing and configured to conduct ions;
an electrode stack located inside the battery housing in electrochemical contact with the electrolyte, the electrode stack including a plurality of first working electrodes interleaved with a plurality of second working electrodes;
a plurality of electrically insulating separators each interposed between a respective pair of the first and second working electrodes and each being configured to transmit therethrough the ions of the electrolyte;
a plurality of electrical voltage sensing devices configured to detect electrode voltage;
a reference electrode mounted onto a first major face of one of the separators and physically contacting one of the second working electrodes, the reference electrode being formed with an electrically conductive and ionically permeable electrode film;
a reference current collector sandwiched between the reference electrode and the one of the separators, the reference current collector electrically connecting the reference electrode to the plurality of electrical voltage sensing devices; and
a plurality of electrical sensing leads each physically contacting a respective discrete region of one of the first working electrodes, each mounted onto a second major face of the one of the separators, opposite the first major face, and each electrically connected to a respective one of the voltage sensing devices to transmit thereto an electrical signal indicative of a real-time voltage of the discrete region to which it abuts, the electrical sensing leads each being formed with an electrically conductive and ionically permeable pad.

15. A method of assembling an electrochemical device, the method comprising:
  receiving a device housing of the electrochemical device;
  locating an electrolyte inside the device housing, the electrolyte being configured to conduct ions;
  locating an electrode stack inside the device housing in electrochemical contact with the electrolyte, the electrode stack including first and second working electrodes;
  locating an electrically insulating separator between the first and second working electrodes, the separator being configured to transmit therethrough the ions of the electrolyte;
  receiving a plurality of electrical sensing devices configured to detect electrode characteristics;
  attaching a reference electrode to a first face of the separator such that the reference electrode abuts the second working electrode;
  connecting the reference electrode to the plurality of electrical sensing devices;
  attaching a plurality of electrical sensing leads to a second face of the separator, opposite the first face, such that each of the electrical sensing leads abuts a respective discrete region of the first working electrode; and
  connecting each of the electrical sensing leads to a respective one of the sensing devices to transmit thereto an electrical signal indicative of an electrical characteristic of the discrete region to which it abuts.

16. The method of claim 15, further comprising locating a reference current collector between the reference electrode and the separator, the reference current collector electrically connecting the reference electrode to the plurality of electrical sensing devices.

17. The method of claim 16, wherein the reference current collector is a single-piece construction formed with an electrically conductive material and having a collector surface area smaller than a reference surface area of the reference electrode.

18. The method of claim 15, wherein the reference electrode is a single-piece construction formed with an electroactive material and having a reference surface area substantially coterminous with a separator surface area of the first side of the separator.

19. The method of claim 15, wherein each of the electrical sensing leads is formed with an electrically conductive and ionically permeable pad with a lead thickness of approximately 0.01 micrometers ($\mu$m) to about 1.0 $\mu$m.

20. The method of claim 15, further comprising fixing a plurality of electrical wires or traces to the second face of the separator, each of the electrical wires or traces electrically connecting a respective one of the electrical sensing leads to a respective one of the sensing devices.

* * * * *